(12) United States Patent
Lee et al.

(10) Patent No.: US 6,448,149 B1
(45) Date of Patent: Sep. 10, 2002

(54) METHOD FOR MAKING SHALLOW TRENCH ISOLATION IN SEMICONDUCTOR FABRICATION

(75) Inventors: Seung-Jae Lee, Suwon; Soo-Seun Lee, Hwasong-gun; Hoon Lim, Seoul, all of (KR)

(73) Assignee: Samsung Electronics Co, Ltd., Hwasung (KR)

( * ) Notice: Subject to any disclaimer, the term of this patent is extended or adjusted under 35 U.S.C. 154(b) by 0 days.

(21) Appl. No.: 09/608,030

(22) Filed: Jun. 30, 2000

(30) Foreign Application Priority Data

Jul. 3, 1999 (KR) .............................. 99-26765

(51) Int. Cl.$^7$ .............................................. H01L 21/76
(52) U.S. Cl. ................... 438/424; 438/238; 438/239; 438/243; 438/244; 438/692
(58) Field of Search ................... 438/692, 693, 438/697, 243, 244, 404, 424, 427, 428, 438, 238, 239, 435, 437, 703

(56) References Cited

U.S. PATENT DOCUMENTS

| | | | | |
|---|---|---|---|---|
| 5,726,090 A | * | 3/1998 | Jang et al. | 438/435 |
| 5,741,740 A | * | 4/1998 | Jang et al. | 438/435 |
| 5,918,120 A | * | 6/1999 | Huang | 438/239 |
| 6,048,775 A | * | 4/2000 | Yao et al. | 438/427 |
| 6,090,714 A | * | 7/2000 | Jang et al. | 438/692 |
| 6,100,163 A | * | 8/2000 | Jang et al. | 438/437 |
| 6,150,212 A | * | 11/2000 | Divakaruni et al. | 438/244 |
| 6,197,630 B1 | * | 3/2001 | Wu et al. | 438/238 |
| 6,214,735 B1 | * | 4/2001 | Kim et al. | 438/703 |
| 6,242,322 B1 | * | 6/2001 | Chen et al. | 438/424 |
| 6,245,691 B1 | * | 6/2001 | Jang et al. | 438/787 |
| 6,261,923 B1 | * | 7/2001 | Kuo et al. | 438/427 |
| 6,300,219 B1 | * | 10/2001 | Doan et al. | 438/424 |
| 6,303,461 B1 | * | 10/2001 | Chen et al. | 438/404 |
| 6,335,235 B1 | * | 1/2002 | Bhakta et al. | 438/218 |

\* cited by examiner

Primary Examiner—Matthew Smith
Assistant Examiner—V. Yevsikov
(74) Attorney, Agent, or Firm—Marger Johnson & McCollom, P.C.

(57) ABSTRACT

A method for making the Shallow Trench Isolation (STI) of a semiconductor device. An active mask layer is formed on a semiconductor substrate. Then the active mask layer and semiconductor substrate are etched to form a plurality of trenches. Next, an oxide layer is deposited by High Density Plasma Chemical Vapor Deposition (HDP-CVD) over the active mask layer so as to fill the trenches to a thickness greater than the depth of the trenches and less than the sum of the depth and the thickness of the active mask layer. A capping oxide layer is formed over the HDP-CVD oxide layer by means of plasma source of Tetra-Ethyl-Ortho-Silicate (TEOS). Subsequently, the capping oxide layer and HDP-CVD oxide layer are polished so as to expose the active mask layer. Thus, the Idoff characteristics of the transistor and thus the refresh characteristics of DRAM can be improved. Further, in another embodiment of the present invention, the HDP-CVD oxide layer partially fills the trenches, reducing the aspect ratio of the trenches. As a result, subsequent ozone-TEOS USG layer can completely fill the trenches without the formation of voids.

23 Claims, 11 Drawing Sheets

METHOD FOR MAKING SHALLOW TRENCH ISOLATION IN SEMICONDUCTOR FABRICATION

BACKGROUND OF THE INVENTION

1. Field of the Invention

The present invention relates to a method for fabricating a semiconductor device, and more particularly, to a method for making shallow trench isolation (STI) to reduce the leakage current of the transistors and to achieve desired gap filling in semiconductor fabrication.

2. Description of the Related Art

When fabricating integrated circuits, individual devices such as transistors, diodes, resistors must be electrically isolated from one another. The semiconductor manufacturing process typically begins with the formation of isolation structures. The isolation formation procedure, thus, critically affects the sizes of the active regions and the process margin of subsequent processing.

One of a variety of technologies for forming the isolation structures is LOCOS (LOCal Oxidation of Silicon), which is generally employed for obtaining the device geometry of sub-half micron order. In a typical LOCOS isolation formation procedure, a pad oxide layer and a nitride layer are sequentially formed on a silicon substrate. Then the nitride layer is patterned. And the silicon substrate is selectively oxidized to form field oxide layers. Such LOCOS isolation inherently has the drawback called "bird's beak effect." It is because oxidants laterally diffuse at the edges of the silicon nitride during the formation of the isolation structures. Thus, an oxide forms under the nitride edges and lifts the nitride edges. This lateral extension of the field oxide into the device active regions shortens the channel length. Thus, this phenomenon is called "narrow channel effect", increasing the threshold voltage, thereby degrading the electrical characteristics of the transistors. Moreover, as the channel length is reduced below 0.3 $\mu$m, "punch-through" can occur. As a result, the active regions may not be properly secured.

Hence, the STI has been considered as a replacement for the conventional LOCOS for semiconductor devices having a design-rule of about 0.25 $\mu$m and under. Typically, the STI process begins with etching of trenches with a prescribed depth on a silicon substrate. Then an insulating layer is deposited over the substrate with the trenchs. The insulating layer is subject to etching-back or chemical mechanical polishing (CMP) process to finally have the trenches filled with the insulating layer.

Referring to FIGS. 1 to 3, which more specifically describe the STI, a pad oxide layer 11, silicon nitride layer 12, and a high temperature oxide layer (not shown) are sequentially deposited over a semiconductor substrate 10. Then, the layers are partially removed over the regions for forming the trenches on the substrate by a photolithography-and-etch step, to form an active mask layer consisting of the high temperature oxide layer, silicon nitride layer 12, and pad oxide layer 11 over the active regions. The active mask is used to etch the substrate 10 to form the trenches 14 with a predetermined depth. During the etching, the high temperature oxide layer is also removed, as illustrated in FIG. 1.

An ozone-TEOS USG layer 16 is subsequently deposited over the silicon nitride layer 12 with a thickness sufficient to fill the trenches 14, as shown in FIG. 2. In order to reduce the surface tension of the oxide layer filling the trenches 14 and to tightly cover the trenches 14, a capping oxide layer 20 is deposited over the ozone-TEOS USG layer 16 using the plasma-enhanced chemical vapor deposition (PE-CVD), as shown in FIG. 3. After partially etching back the capping oxide layer 20 and ozone-TEOS USG layer 16 to reduce the surface level differences of the substrate, CMP is performed to remove the capping oxide layer 20 and ozone-TEOS USG layer 16 so as to expose the silicon nitride layer 12, thereby forming the STI regions filled with planarized ozone-TEOS USG layer 16.

However, as the aspect ratio of the trenches increases, the trenches are not often fully filled with the ozone-TEOs USG layer, creating voids 18 inside of the trenches. In addition, the quality of the ozone-TEOS USG layer is generally inferior to that if the thermally grown oxides.

SUMMARY OF THE INVENTION

It is an object of the present invention to provide a method for making the STI of a semiconductor device to reduce the leakage current of transistors.

It is another object of the present invention to provide a method for making the STI of a semiconductor device to achieve desired gap filling by reducing the aspect ratio of the trenches.

According to an aspect of the present invention, a method for making the STI (Shallow Trench Isolation) of a semiconductor device, comprises the steps of forming an active mask layer on a semiconductor substrate, etching the semiconductor substrate, using the active mask layer as an etch mask, to produce a plurality of trenches, depositing an oxide layer by HDP-CVD (High Density Plasma Chemical Vapor Deposition) over the active mask layer so as to fill the trenches to a thickness greater than the depth of the trenches and less than the sum of the depth and the thickness of the active mask layer, depositing a capping oxide layer over the HDP-CVD oxide layer by means of plasma source of TEOS (Tetra-Ethyl-Ortho-Silicate), and polishing the capping oxide layer and HDP-CVD oxide layer so as to expose the active mask layer.

Preferably, the step of forming the active mask layer further includes the steps of forming a pad oxide layer over the semiconductor substrate, depositing a silicon nitride layer over the pad oxide layer, and depositing another oxide layer over the silicon nitride layer. The capping oxide layer is deposited with a thickness of 1000~5000 Å.

According to another aspect of the present invention, a method for making the STI of a semiconductor device, comprises the steps of forming an active mask layer on a semiconductor substrate, etching the active mask layer and semiconductor substrate to produce a plurality of trenches so as to form a first wide active mask region between two of the trenches and a second narrow active mask region between other two of the trenches, depositing an oxide layer by HDP-CVD over the active mask layer so as to fill the trenches, the thickness of the HDP-CVD oxide layer on the first wide mask region being greater than that on the second narrow mask region, depositing a capping oxide layer over the HDP-CVD oxide layer by means of plasma source of TEOS, partially etching back the capping oxide layer and HDP-CVD oxide layer on the first wide active mask region, and polishing the capping oxide layer and HDP-CVD oxide layer so as to expose the active mask layer.

Preferably, the step of partially etching back the capping oxide layer and HDP-CVD oxide layer further includes photolithography to open the first wide active mask region. The HDP-CVD oxide layer is deposited over the active mask layer so as to fill the trenches to a thickness greater than the depth of the trenches and less than the sum of the depth of the trenches and the thickness of the active mask layer.

According to still another aspect of the present invention, a method for making the STI of a semiconductor device comprises the steps of forming an active mask layer on a semiconductor substrate, etching the active mask layer and semiconductor substrate to produce a plurality of trenches, depositing an oxide layer by HDP-CVD over the active mask layer so as to partially fill the trenches to reduce the aspect ratio of the trenches, depositing an ozone-TEOS USG layer over the HDP-CVD oxide layer so as to the trenches, depositing a capping oxide layer over the ozone-TEOS USG layer by means of plasma source of TEOS, and polishing the capping oxide layer, ozone-TEOS USG layer and HDP-CVD oxide layer so as to expose the active mask layer.

Thus, the deposition of the capping oxide layer of PE-TEOS after filling the trenches with the HDP-CVD oxide layer results in improvement in the leakage current and refresh characteristics of the transistors. In addition, the ozone-TEOS USG layer is deposited to fill without voids the trenches previously partially filled with the HDP-CVD oxide layer to reduce the aspect ratio.

The present invention will now be described more specifically with reference to the drawings attached only by way of example.

BRIEF DESCRIPTION OF THE ATTACHED DRAWINGS

DETAILED DESCRIPTION OF THE PREFERRED EMBODIMENT

Figure 1:
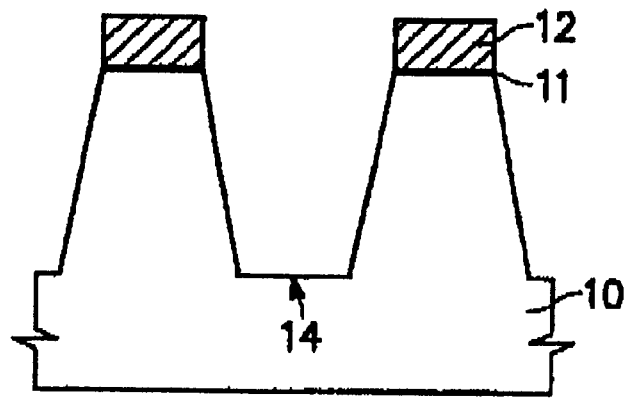
FIGS. 1 to 3 are cross-sectional views of a semiconductor substrate for illustrating the conventional method of making the STI.
Figure 2:
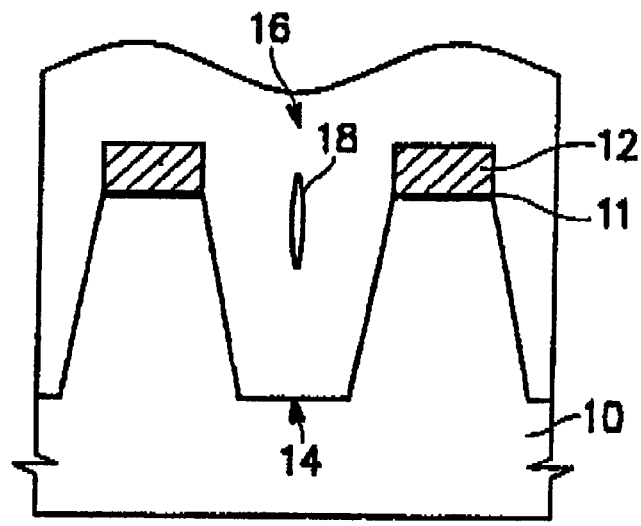
Figure 3:
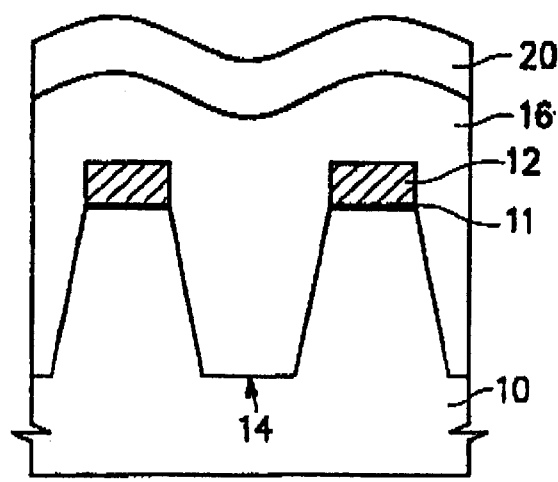
Figure 4:
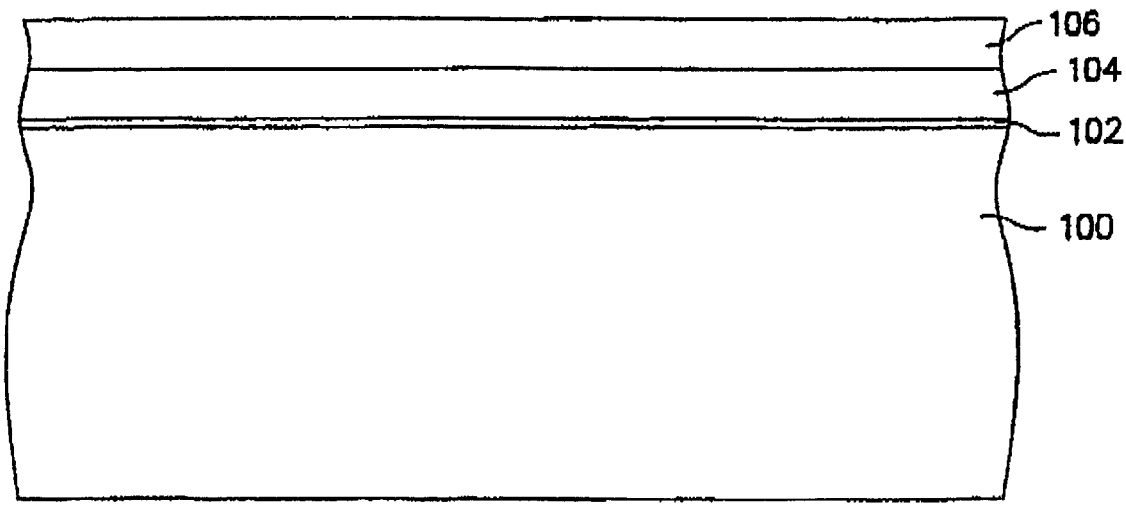
FIGS. 4 to 9 are cross-sectional views of a semiconductor substrate for illustrating a method of making the STI according to an embodiment of the present invention.

FIG. 4 illustrates the formation of an active mask layer on a semiconductor substrate 100. First, the semiconductor substrate 100 is subjected to a thermal oxidation process, growing a pad oxide layer 102 thereon to a thickness of about 110~200 Å. Subsequently deposited over the pad oxide layer 102 is a silicon nitride layer 104 to a thickness of about 1500~2000 Å using conventional techniques such as LPCVD (Low Pressure Chemical Vapor Deposition). The silicon nitride layer 104 serves as the polish-stop in a subsequent CMP step. A high temperature oxide layer 106 is deposited over the silicon nitride layer 104 to a thickness of about 1500 ~2000 Å using conventional CVD techniques. A photolithographyand-etch process is then performed to remove the portions of the high temperature oxide layer 106, silicon nitride layer 104 and pad oxide layer 102 in the field regions to form trenches 108 shown in FIG. 5. As a result, the remaining active regions are covered by the active mask layer comprising the high temperature oxide layer 106, silicon nitride layer 104 and pad oxide layer 102.

Figure 5:
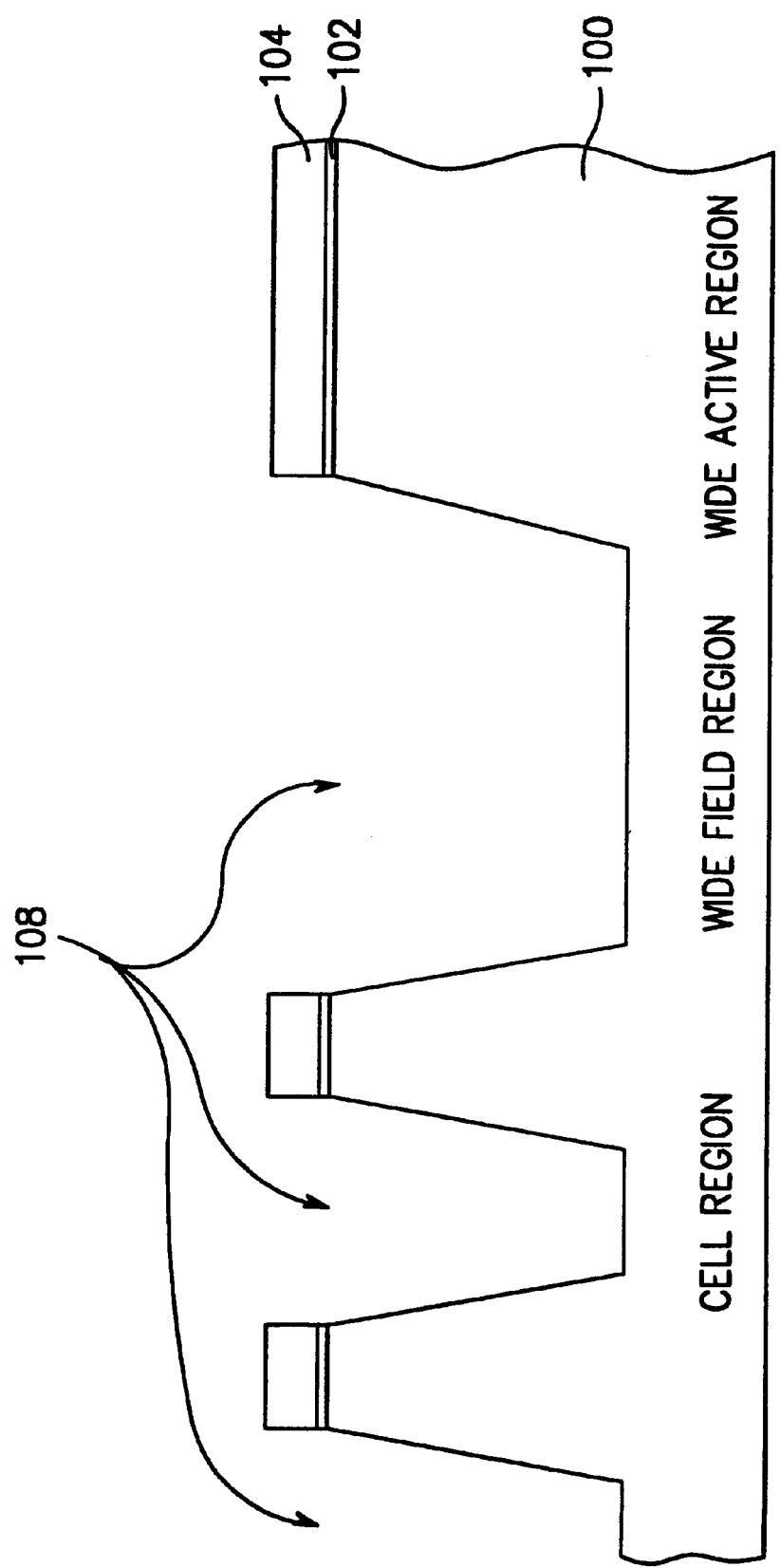

Referring to FIG. 5, a plurality of trenches 108 having a depth of about 2500~5000 Å are formed by subjecting semiconductor substrate 100 to reactive ion etching (RIE) using the active mask layer as an etching mask. The high temperature oxide layer 106 of the active mask layer can also be removed in this step.

Figure 6:
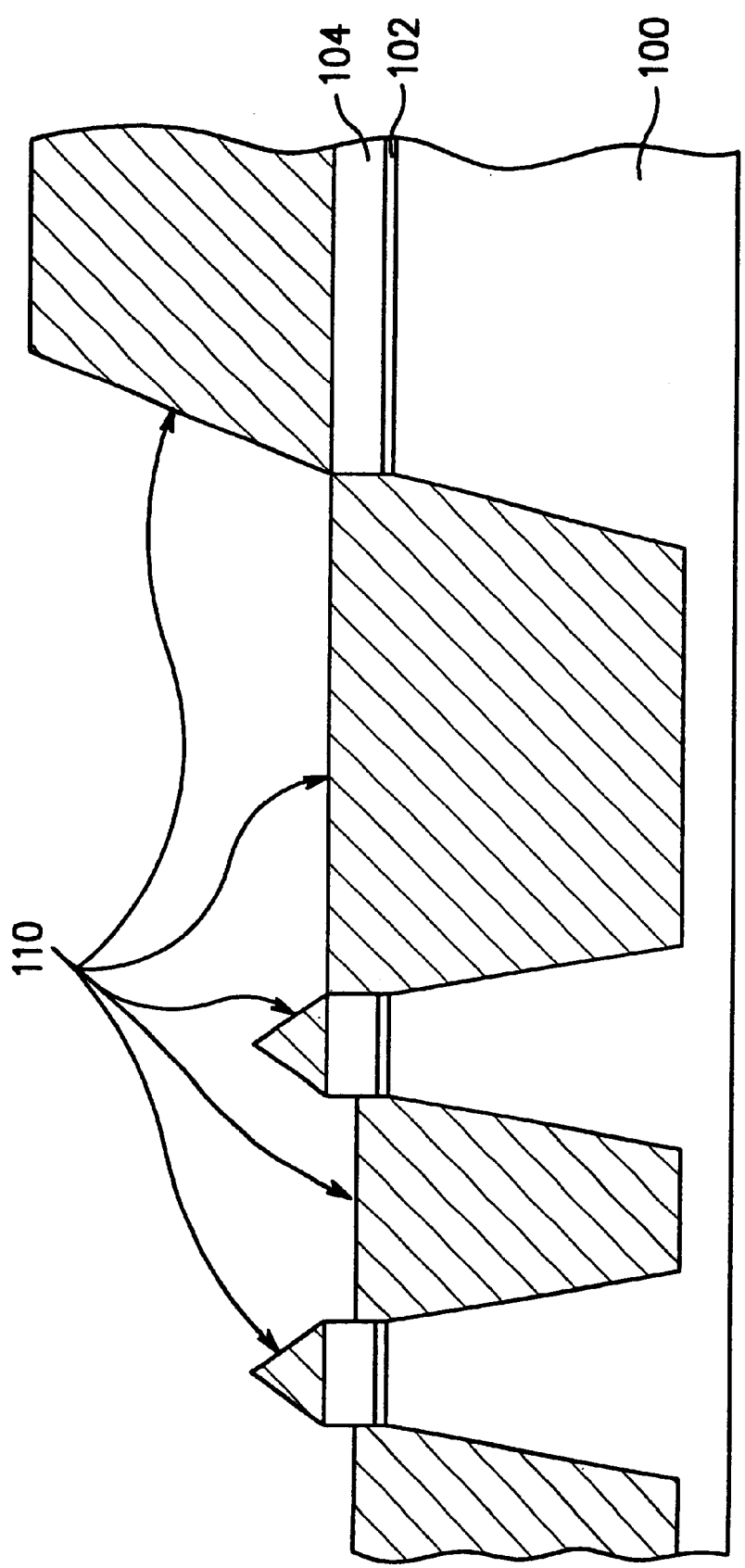

FIG. 6 is shown for illustrating the process steps for forming an HDP-CVD oxide layer 110. First, the thermal oxidation process is performed to grow a thermal oxide layer (not shown) on the sidewalls of the trenches with a thickness of more than about 70 Å. This thermal oxide layer is formed to compensate etching damage from the impact of high energy ions during etching of trenches 108. Thereafter, a silicon nitride layer (not shown) is deposited by LPCVD over the substrate 100 with a thickness of more than about 45 Å. The silicon nitride layer prevents a subsequent gap-filling oxide layer, during annealing, from diffusing impurities into the substrate 100, generating leakage currents. Following this, the silicon nitride layer is covered with an oxide layer (not shown) by LPCVD with a thickness of more than about 100 Å. The oxide layer protects the silicon nitride layer from being damaged during the deposition of the subsequent HDP-CVD oxide layer.

Finally, the HDP-CVD oxide layer 110 is deposited over the substrate, using plasma sources such as $SiH_4$, $O_2$ and Ar gases, preferably to a thickness greater than the depth of the trench 108 and less than the sum of the trench depth and the thickness of the silicon nitride 104. The HDP-CVD oxide layer 110 is more stable than the ozone-TEOS USG layer conventionally used for gap filling. HDP-CVD oxide layer is particularly more densified because of high energy ions generated by $SiH_4$ and $O_2$. Besides, the HDP-CVD oxide layer 110 has a profile that is inclined at an angle of approximately 45° due to the simultaneous sputtering of $SiO_2$ occurring at comers as illustrated in FIG. 6. Since the sputter rate is greater in the narrow regions than in the wide regions, the thickness of the HDP-CVD oxide layer 110 is greater on the wide regions than on the narrow regions such as memory cell regions, as shown in the drawing. This creates the level differences or steps between the narrow active mask regions and the wide active mask regions depending on the depth of the trenches 108.

Figure 7:
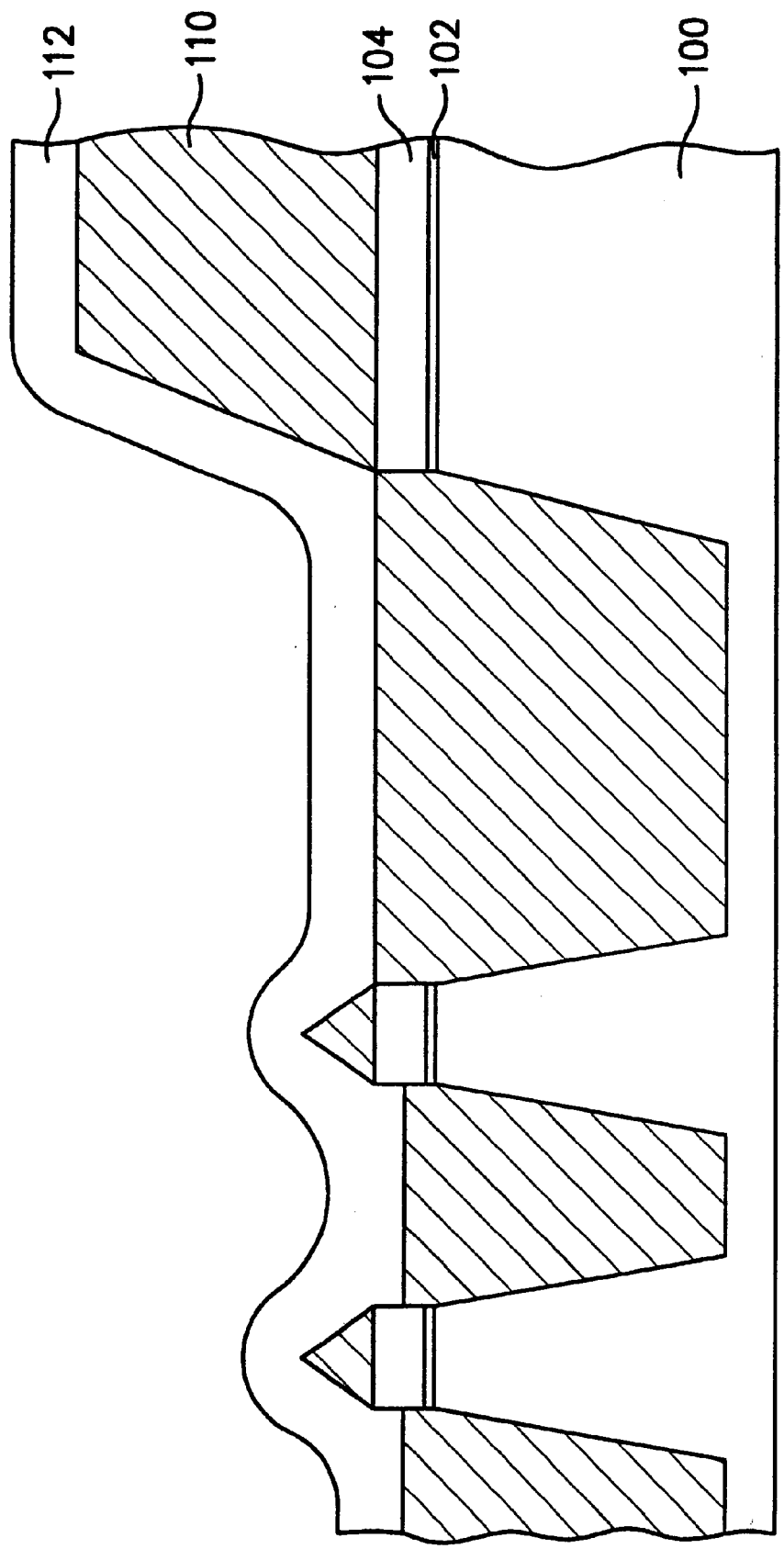

Referring to FIG. 7, the PE-TEOS capping oxide layer 112 is deposited over the HDP-CVD oxide layer 110 by means of plasma source of TEOS ($Si(OC_2H_2)_4$) with a thickness of about 1000~5000 Å to reduce the interfacial stress of the lower and also tightly cover the lower layer.

Figure 10:
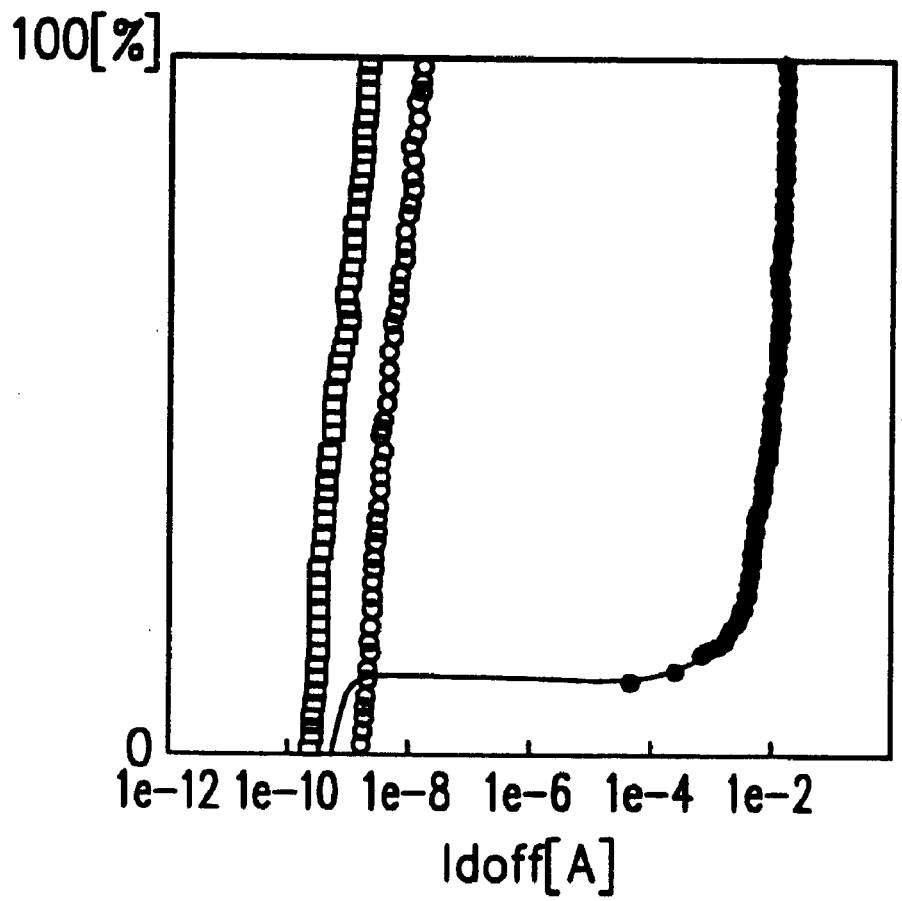
FIG. 10 is a graph for illustrating the leakage current characteristics of transistors at standby depending on the materials for forming the capping oxide layer.

This considerably improves the characteristics of the leakage current Idoff of the transistor at standby compared to the capping oxide layer formed by PE-$SiH_4$ on ozone-TEOS USG, as shown in FIG. 10, which compares the Idoff characteristics of the capping oxide layers respectively formed by PE-TEOS on the HDP-CVD oxide layer filling the trenches, PE-TEOS on the ozone-TEOS USG filling the trenches, and PE-$SiH_4$ on the HDP-CVD oxide layer filling the trenches, indicated by and "□","○", and "●", respectively. Among these, the PE-TEOS capping oxide layer deposited on the HDP-CVD oxide layer filling the trenches shows the best Idoff characteristics of the transistor by about 1.0e-10 amps (A), while the PE-$SiH_4$ capping oxide layer shows the worst Idoff characteristics of the transistor by about 1.0e-02 amps (A).

The PE-TEOS capping oxide layer deposited on the ozone-TEOS USG layer filling the trenches shows the relatively good Idoff characteristics of the transistor by about 1.0e-09 amps (A). However, as the aspect ratio of the trench is increased, the gap filling without voids may not be achieved by the ozone-TEOS USG only. Hence, as in the present invention, PE-TEOS capping oxide layer deposited on the HDP-CVD oxide layer filling the trenches is most advantageous for the Idoff characteristics of the transistor. Thus, in accordance with the present invention, the leakage current can be reduced to improve the refresh characteristics of the DRAM.

Figure 8:
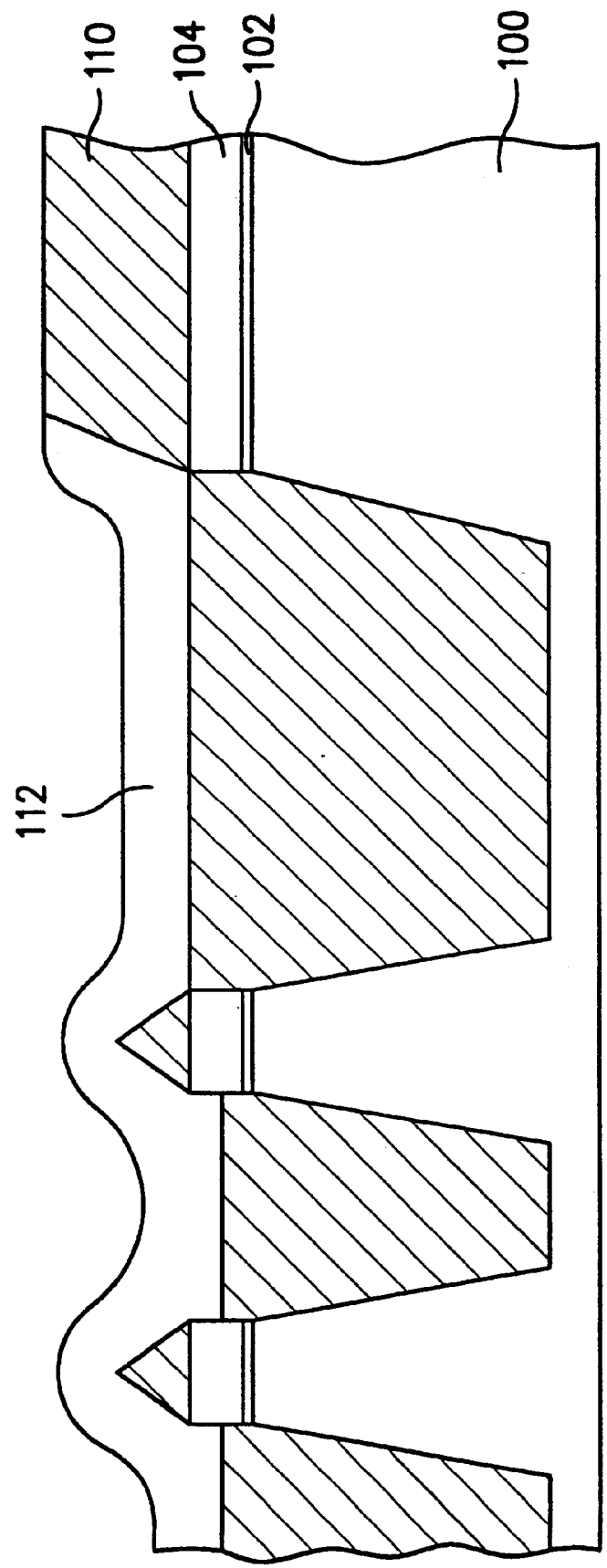

Referring to FIG. 8, the capping oxide layer 112 and HDP-CVD oxide layer 110 on the wide active mask regions are partially etched-back. Before the etched-back, the substrate 100 is annealed in the atmosphere of inert gases at a high temperature of about 800~1050° C., so that the capping oxide layer 112 and HDP-CVD oxide layer 110 are densified to reduce the wet etch rate and to be uniformly etched. After opening the wide active mask regions by a photolithography step, the capping oxide layer 112 and HDP-CVD oxide layer 110 are partially etched back by timed etching to reduce the steps between the wide active mask regions and narrow active mask regions.

Figure 9:
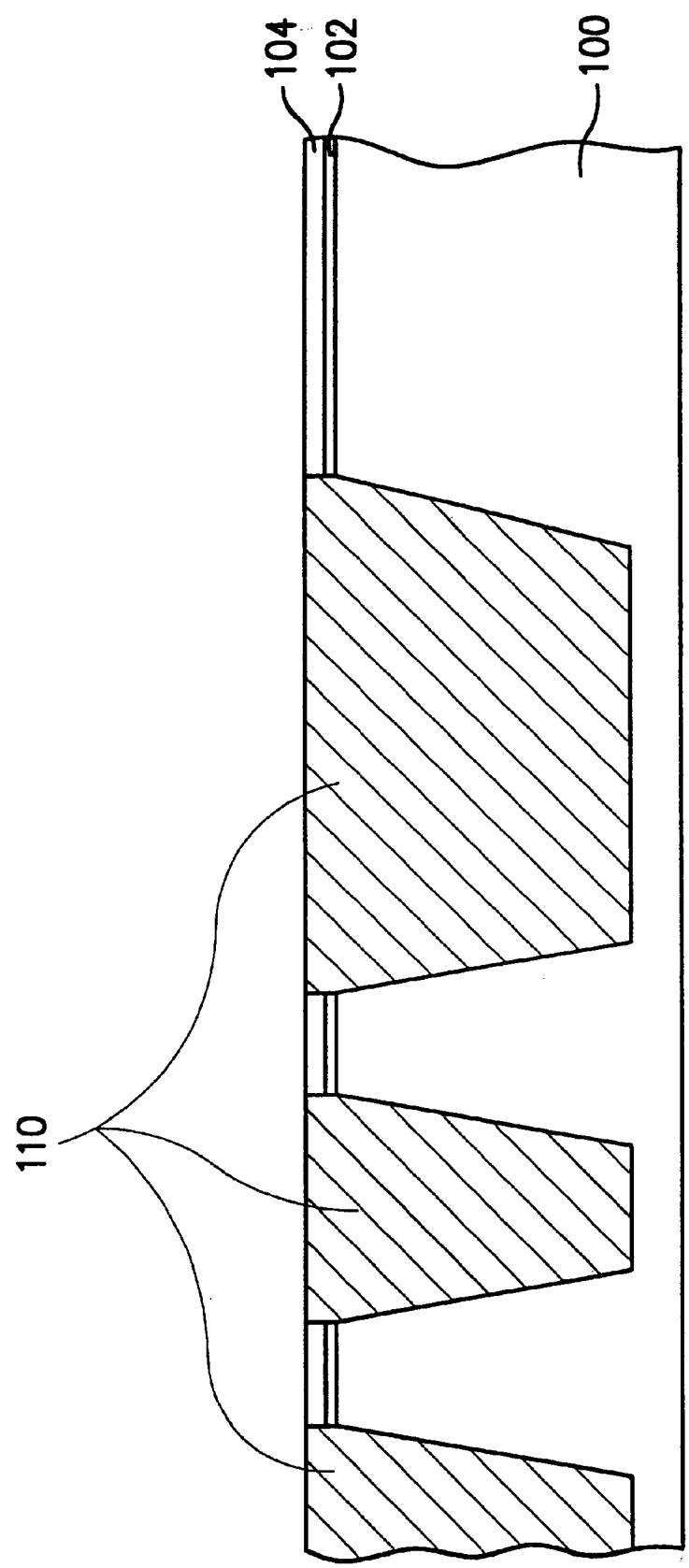

As shown in FIG. 9, the capping oxide layer 112 and HDP-CVD oxide layer 110 remaining on the active mask regions are subsequently polished by CMP to expose the silicon nitride layer 104, thus completing the STI regions filled with the planarized HDP-CVD oxide layer 110. Finally, the silicon nitride layer 104 and pad oxide layer 102 are sequentially removed between the STI regions.

Figure 11:
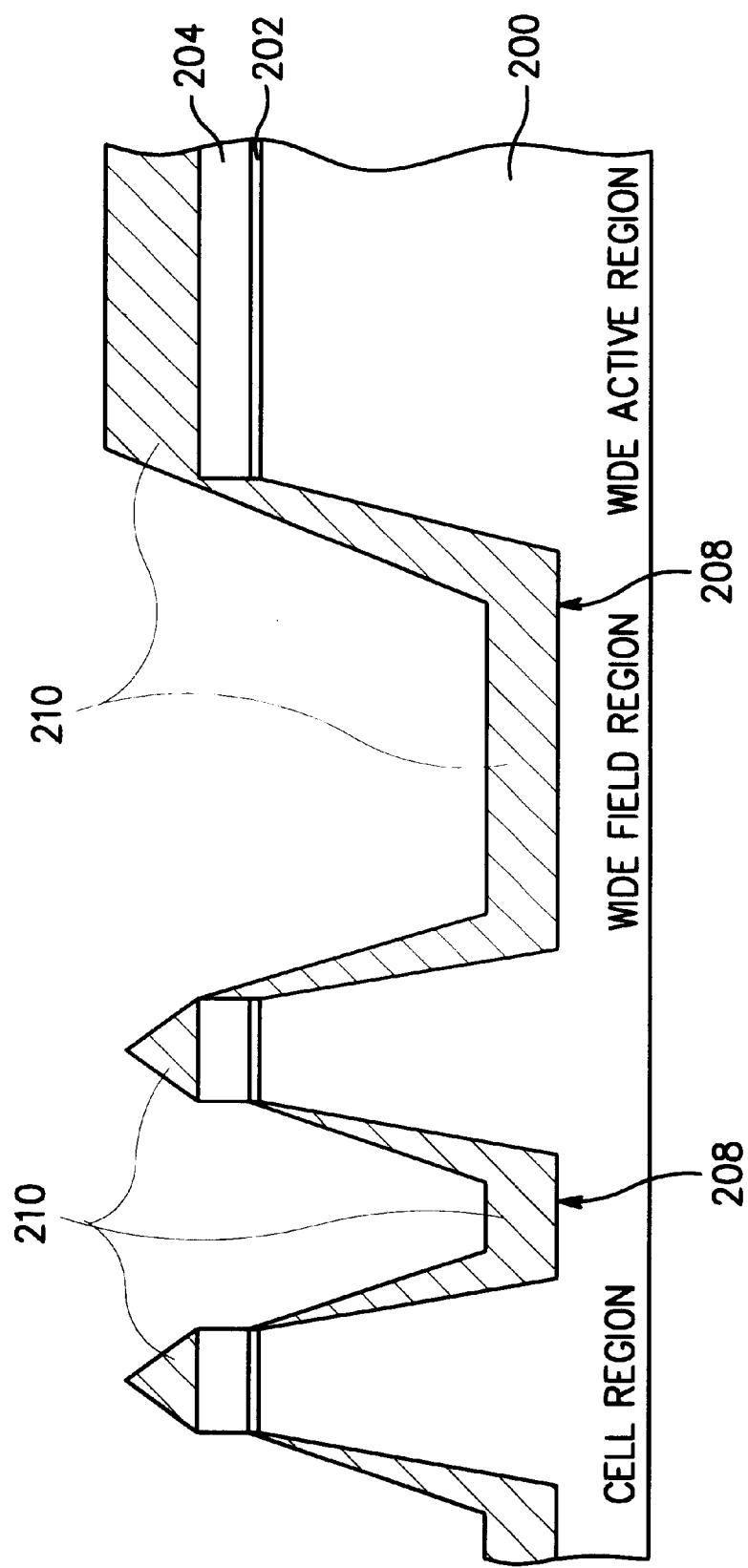
FIGS. 11 to 13 are cross sectional views of a semiconductor substrate for illustrating a method of making the STI according to another embodiment of the present invention.
Figure 12:
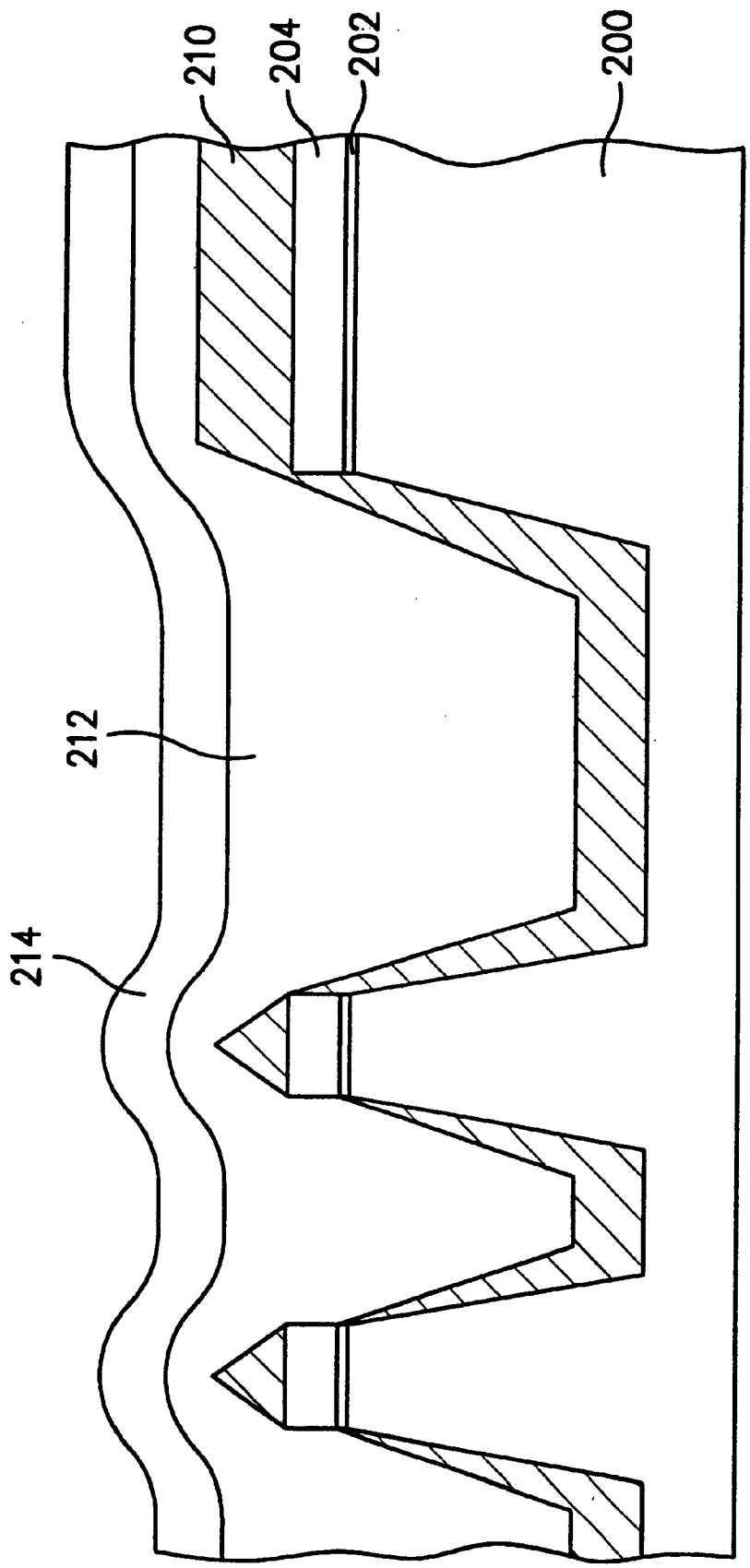
Figure 13:
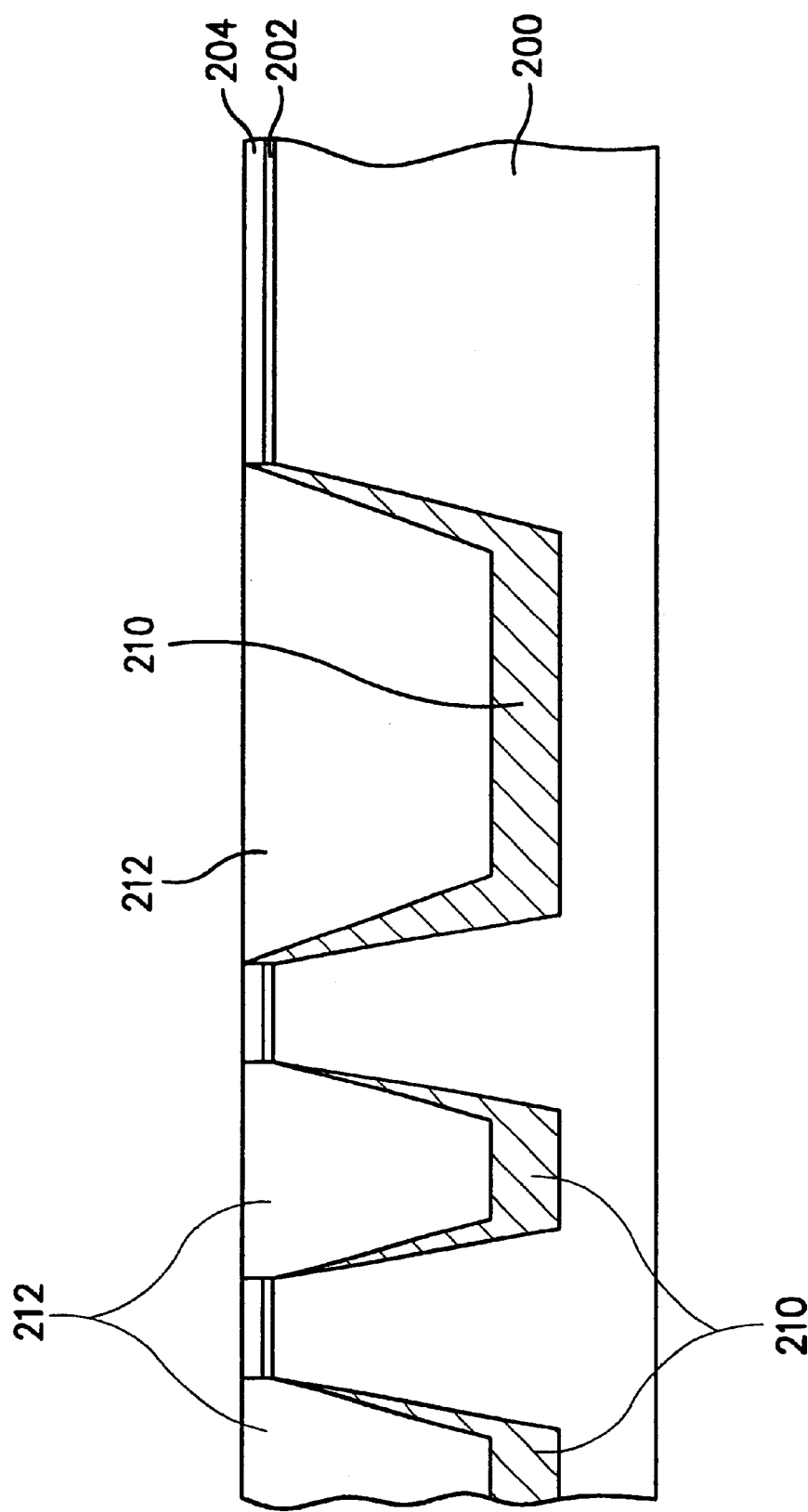

FIGS. 11 to 13 illustrate another preferred embodiment of resent invention, in which a semiconductor substrate 200 is etched to form a plurality of trenches 208 using an active mask layer formed of a pad oxide layer 202 and silicon nitride layer 204 similar to the embodiment as described above. An HDP-CVD oxide layer 210 is deposited over the active mask layer with the trenches 208 to be partially filled. Preferably, the HDP-CVD oxide layer 210 is deposited to a thickness of less than three-quarters and most preferably less than one-quarter, as shown in FIG. 11, of the depth of the trenches 208. Since the HDP-CVD oxide layer 210 is deposited accompanying sputter etching, if the process is designed to partially fill the trench 208, the deposition hardly occurs on the sidewalls of the trench, but occurs actively on the bottom portion thereof. Consequently, this reduces the aspect ratio of the trench 208 as well as the thickness difference of the HDP-CVD oxide layer 210 between the wide active mask regions and narrow active mask regions.

Referring to FIG. 12, after subjecting the substrate 200 to an $NH_3$ plasma process, an ozone-TEOS USG layer 212 is deposited over the HDP-CVD oxide layer 210 to a thickness enough to fill the trenches 208. The $NH_3$ process is to eliminate the lower layer dependency of the ozone-TEOS USG layer 212. It is preferable to deposit the ozone-TEOS USG layer 212 to a thickness approximately equal to the sum of the depth of the trench and the thickness of the silicon nitride layer 204. Conventionally, the ozone-TEOS USG layer 212 used as the gap filling tends to generate voids in the center portion of the trench with increase of the aspect ratio of the trench. However, with the present invention method employing the HDP-CVD oxide layer 210 to reduce the aspect ratio of the trench 208 before filling the trench with the ozone-TEOS USG layer 212, the voids formation in the center portion of the trench 208 can be avoided. A capping oxide layer 214 is subsequently deposited over the ozone-TEOS USG layer 212 with a thickness of about 1000~5000 Å by means of plasma source of TEOS. The PE-TEOS capping oxide layer 214 reduces the interfacial stress of the ozone-TEOS USG layer 212, improving the Idoff characteristics of the transistor.

As shown in FIG. 13, the capping oxide layer 214, ozone-TEOS USG layer 212 and the HDP-CVD oxide layer 210 remaining on the active mask regions are removed by CMP to expose the silicon nitride layer 204 to form the STI regions filled with the planarized ozone-TEOS USG layer 212 and HDP-CVD oxide layer 210. Finally, the silicon nitride layer 204 and pad oxide layer 202 are sequentially removed to fabricate semiconductor elements on the substrate 200 between the STI regions. In the present invention, since the HDP-CVD oxide layer partially fills the trenches, it reduces the aspect ratio of the trenches. As a result, subsequent ozone-TEOS USG layer can completely fill the trenches without voids. In addition, the partial deposition of the HDP-CVD oxide layer reduces the steps between the wide active mask regions and narrow active mask regions, an additional photolithography is not required to etch the oxide layers of the wide active mask regions, thus simplifying the fabrication process.

In conclusion, according to one embodiment of the present invention, the deposition of the PE-TEOS capping oxide layer after filling the trench with the HDP-CVD oxide layer serves to improve the Idoff characteristics of the transistor, and thus the refresh characteristics of a memory device such as a DRAM. Also, according to another embodiment of the present invention, since the HDP-CVD oxide layer partially fills the trenches, the aspect ratio of the trenches is reduced and a subsequent ozone-TEOS USG layer can completely fill the trenches without voids.

While the present invention has been described in connection with specific embodiments accompanied by the attached drawings, it will be readily apparent to those skilled in the art that various changes and modifications may be made thereto without departing the sprit and scope of the present invention.

What is claimed is:

1. A method of fabricating Shallow Trench Isolation (STI) structures for a semiconductor device, comprising:

forming an active mask layer on a semiconductor substrate;

etching the semiconductor substrate to form a plurality of trenches therein, using said active mask layer as an etch mask;

depositing an oxide layer by High Density Plasma Chemical Vapor Deposition (HDP-CVD) over said active mask layer so as to fill said trenches to a thickness greater than the depth of said trenches and less than the sum of said depth and the thickness of said active mask layer;

depositing a capping oxide layer over said HDP-CVD oxide layer by means of plasma source of Tetra-Ethyl-Ortho-Silicate (TEOS); and polishing said capping oxide layer and HDP-CVD oxide layer so as to expose said active mask layer.

2. A method as defined in claim 1, wherein the step of forming said active mask layer further includes the steps of:

forming a pad oxide layer over said semiconductor substrate;

depositing a silicon nitride layer over said pad oxide layer; and depositing a second oxide layer over said silicon nitride layer.

3. A method as defined in claim 1, wherein said capping oxide layer is deposited to a thickness of approximately 1000~5000 Å.

4. A method as defined in claim 1, further comprising, before the step of depositing an oxide layer by HDP-CVD, forming a thermal oxide layer on sidewalls of said trenches;

forming a silicon nitride layer over said thermal oxide layer; and forming a second oxide layer over said silicon nitride layer.

5. A method fabricating shallow trench isolation (STI) structures for a semiconductor device, comprising:

forming an active mask layer on a semiconductor substrate;

etching the semiconductor substrate to form a plurality of trenches in the semiconductor substrate, using said active mask layer as an etch mask, so as to form a wide active mask region between a first pair of said trenches and a narrow active mask region between a second pair of said trenches;

depositing an HDP-CVD oxide layer over said active mask layer so as to fill said trenches, a first thickness of said HDP-CVD oxide layer on said first wide mask region being greater than a second thickness of said HDP-CVD oxide layer on said second narrow mask region;

depositing a capping oxide layer over said HDP-CVD oxide layer by means of plasma source of TEOS;

partially etching back said capping oxide layer and said HDP-CVD oxide layer on said first wide active mask region; and polishing said capping oxide layer and said HDP-CVD oxide layer so as to expose said active mask layer.

6. A method as defined in claim 5, wherein the step of forming said active mask layer further includes the steps of:

forming a pad oxide layer over said semiconductor substrate;

depositing a silicon nitride layer over said pad oxide layer; and depositing a second oxide layer over said silicon nitride layer.

7. A method as defined in claim 5, wherein said HDP-CVD oxide layer is deposited over said active mask layer so as to fill said trenches to a thickness greater than the depth of said trenches and less than the sum of said depth and the thickness of said active mask layer.

8. A method as defined in claim 5, wherein the step of partially etching back said capping oxide layer and HDP-CVD oxide layer comprises opening said first wide active mask region using a photolithography-and-etch step.

9. A method defined in claim 5, wherein said capping oxide layer is deposited to a thickness of 1000~5000 Å.

10. A method as defined in claim 5, further comprising, before said step of partially etching, annealing said substrate at a temperature of approximately 800–1050° C.

11. A method of fabricating shallow trench isolation (STI) structures for a semiconductor device, comprising:

forming an active mask layer on a semiconductor substrate;

etching said active mask layer and semiconductor substrate to form a plurality of trenches in the semiconductor substrate;

depositing an oxide layer by HDP-CVD over said active mask layer so as to partially fill said trenches to reduce the aspect ratio of said trenches;

depositing an ozone-TEOS USG layer over said HDP-CVD oxide layer so as to fill said trenches; and polishing said ozone-TEOS USG layer and said HDP-CVD oxide layer so as to expose said active mask layer.

12. A method as defined in claim 11, wherein the step of forming said active mask layer further includes the steps of:

forming a pad oxide layer over said semiconductor substrate;

depositing a silicon nitride layer over said pad oxide layer; and depositing a second oxide layer over said silicon nitride layer.

13. A method as defined in claim 12, wherein the thickness of the deposited ozone-TEOS USG layer is approximately equal to the sum of the depth of said trenches and the thickness of the silicon nitride layer.

14. A method as defined in claim 11, wherein said HDP-CVD oxide layer is deposited to a thickness less than approximately three-quarters of the depth of said trenches.

15. A method as defined in claim 11, wherein said HDP-CVD oxide layer is deposited to a thickness less than approximately one-quarter of the depth of said trenches.

16. A method as defined in claim 11, which further comprises forming a capping layer over said ozone-TEOS USG layer, wherein the step of polishing said ozone-TEOS USG layer and said HDP-CVD oxide layer further includes polishing said capping layer.

17. A method as defined in claim 16, wherein said capping layer is a capping oxide layer formed by means of plasma source of TEOS.

18. A method as defined in claim 11, wherein said capping oxide layer is deposited to a thickness of 1000~5000 Å.

19. A method as defined in claim 11, which further comprises performing an $NH_3$ plasma process before the step of depositing an ozone-TEOS USG layer.

20. A method of fabricating Shallow Trench Isolation (STI) structures for a semiconductor device, comprising:

forming a trench in a semiconductor substrate;

depositing a dielectric layer to fill the trench;

depositing a capping oxide layer over the dielectric layer by means of plasma source of Tetra-Ethyl-Ortho-Silicate (TEOS); and removing the capping oxide layer and a portion of the dielectric layer so as to form a STI region in the trench.

21. A method as defined in claim 20, wherein the dielectric layer comprises an HDP-CVD oxide layer.

22. A method as defined in claim 20, wherein the depositing the dielectric layer comprising:

depositing an HDP-CVD oxide layer so as to partially fill the trench to reduce the aspect ratio of the trench; and depositing an ozone-TEOS USG layer over the HDP-CVD oxide layer so as to fill the trench.

23. A method as defined in claim 20, before depositing the dielectric layer, further comprising:

forming a thermal oxide layer on sidewalls of said trench;

forming a silicon nitride layer over said thermal oxide layer; and forming a second oxide layer over said silicon nitride layer.

* * * * *

UNITED STATES PATENT AND TRADEMARK OFFICE
CERTIFICATE OF CORRECTION

PATENT NO. : 6,448,149 B1
DATED : September 10, 2002
INVENTOR(S) : Seung-Jae Lee et al.

It is certified that error appears in the above-identified patent and that said Letters Patent is hereby corrected as shown below:

Column 3,
Line 9, "so as to the" should read -- so as to form the --;

Column 8,
Line 31, "claim 11" should read -- claim 17 --.

Signed and Sealed this

Sixth Day of May, 2003

JAMES E. ROGAN
*Director of the United States Patent and Trademark Office*